US012224193B2

(12) United States Patent
Shindo

(10) Patent No.: US 12,224,193 B2
(45) Date of Patent: Feb. 11, 2025

(54) CONTROL METHOD AND SUBSTRATE TRANSFER SYSTEM

(71) Applicant: TOKYO ELECTRON LIMITED, Tokyo (JP)

(72) Inventor: Takehiro Shindo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 642 days.

(21) Appl. No.: 17/474,644

(22) Filed: Sep. 14, 2021

(65) Prior Publication Data

US 2022/0084862 A1 Mar. 17, 2022

(30) Foreign Application Priority Data

Sep. 17, 2020 (JP) .................................. 2020-156679

(51) Int. Cl.
*H01L 21/677* (2006.01)
*B25J 9/16* (2006.01)
*H01L 21/67* (2006.01)
*H01L 21/68* (2006.01)

(52) U.S. Cl.
CPC ...... *H01L 21/67742* (2013.01); *B25J 9/1694* (2013.01); *H01L 21/67259* (2013.01); *H01L 21/67766* (2013.01); *H01L 21/68* (2013.01)

(58) Field of Classification Search
CPC ......... H01L 21/67742; H01L 21/67259; H01L 21/67766; H01L 21/68; H01L 21/67748; H01L 21/67739; H01L 21/681; H01L 21/68707; B25J 9/1694; B25J 11/0095
See application file for complete search history.

(56) References Cited

U.S. PATENT DOCUMENTS

| | | | |
|---|---|---|---|
| 9,196,518 B1* | 11/2015 | Hofmeister | ....... H01L 21/67259 |
| 10,134,623 B2 | 11/2018 | Yin et al. | |
| 10,978,330 B2 | 4/2021 | Yin et al. | |
| 2007/0071581 A1* | 3/2007 | Gilchrist | ........... H01L 21/67265 |
| | | | 414/217 |
| 2009/0279989 A1* | 11/2009 | Wong | ...................... H01L 21/68 |
| | | | 414/217 |
| 2014/0365011 A1* | 12/2014 | Hosek | .................... B25J 9/1682 |
| | | | 700/259 |

(Continued)

FOREIGN PATENT DOCUMENTS

| | | | |
|---|---|---|---|
| JP | 2003-243479 A | 8/2003 | |
| JP | 2008-311303 A | 12/2008 | |

(Continued)

*Primary Examiner* — Charles Cai
(74) *Attorney, Agent, or Firm* — Fenwick & West LLP

(57) ABSTRACT

An control method of a transfer mechanism is provided. The transfer mechanism transfers a substrate and has a holder for holding the substrate. In the control method, an outer edge of the substrate transferred by the transfer mechanism is detected and a center position of the substrate using a preset adjustment value corresponding to a path for transferring the substrate is measured. Further, in the control method, a target position is corrected based on the amount of displacement between the center position of the substrate and a preset reference position of the holder, and the transfer mechanism is controlled such that the reference position of the holder becomes the corrected target position.

7 Claims, 9 Drawing Sheets

(56) References Cited

U.S. PATENT DOCUMENTS

| | | | |
|---|---|---|---|
| 2016/0136812 A1* | 5/2016 | Hosek | B25J 9/1638 |
| | | | 700/254 |
| 2017/0018446 A1 | 1/2017 | Yin et al. | |
| 2019/0164800 A1 | 5/2019 | Yin et al. | |
| 2021/0305076 A1 | 9/2021 | Yin et al. | |

FOREIGN PATENT DOCUMENTS

| | | | |
|---|---|---|---|
| JP | 2015005682 A * | 1/2015 | |
| KR | 10-2018-0030171 A | 3/2018 | |
| WO | WO 2017/011581 A1 | 1/2017 | |

\* cited by examiner

CONTROL METHOD AND SUBSTRATE TRANSFER SYSTEM

CROSS-REFERENCE TO RELATED APPLICATIONS

This application claims priority to Japanese Patent Application No. 2020-156679, filed on Sep. 17, 2020, the entire contents of which are incorporated herein by reference.

TECHNICAL FIELD

The present disclosure relates to a control method and a substrate transfer system.

BACKGROUND

A substrate transfer system including a transfer mechanism for transferring a substrate such as a wafer or the like is known.

Japanese Patent Application Publication No. 2008-311303 discloses a displacement detecting apparatus for detecting displacement of a target object disposed at a transfer mechanism including a plurality of arms rotatably connected in series and configured to transfer the target object held by a distal end arm. The displacement detecting apparatus includes an edge detecting unit disposed at an arm other than the distal end arm among the arms to detect at least an edge of the target object held by the distal end arm, and a displacement detecting unit for obtaining displacement of the target object based on the detection value of the edge detecting unit.

SUMMARY

A transfer mechanism needs to accurately transfer a substrate to a target position.

One aspect of the present disclosure provides a control method and a substrate transfer system for improving transfer accuracy.

In accordance with an aspect of the present disclosure, there is provided a control method of a transfer mechanism for transferring a substrate and having a holder for holding the substrate. The method comprises detecting an outer edge of the substrate transferred by the transfer mechanism and measuring a center position of the substrate using a preset adjustment value corresponding to a path for transferring the substrate, correcting a target position based on the amount of displacement between the center position of the substrate and a preset reference position of the holder, and controlling the transfer mechanism such that the reference position of the holder becomes the corrected target position.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
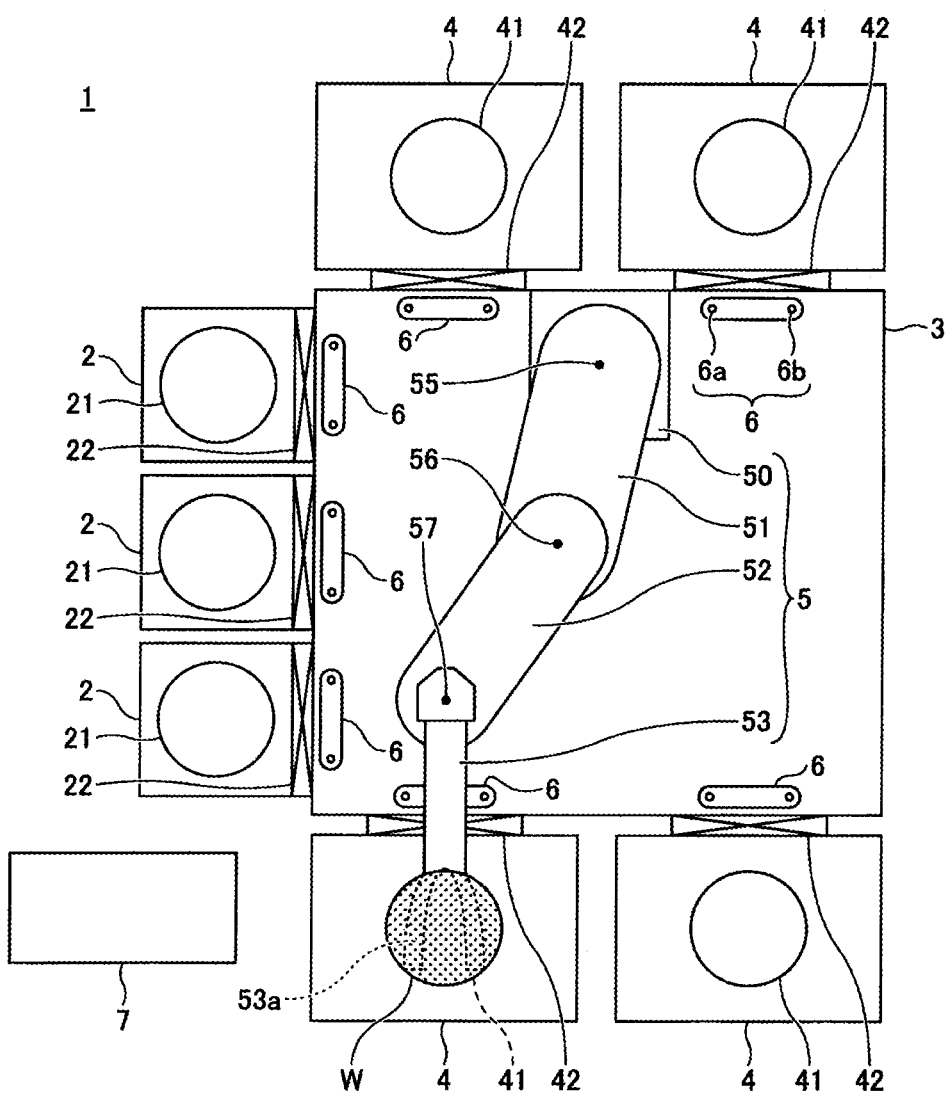
FIG. 1 is an example of a plan view showing a configuration of a substrate processing system according to an embodiment.

Hereinafter, embodiments for implementing the present disclosure will be described in detail with reference to the accompanying drawings. Like reference numerals will be given to like parts throughout the drawings, and redundant description thereof may be omitted.

<Substrate Processing System>

An example of an overall configuration of a substrate processing system 1 according to an embodiment will be described with reference to FIG. 1. FIG. 1 is an example of a plan view showing a configuration of the substrate processing system 1 according to an embodiment. In FIG. 1, a substrate W is hatched with dots. In the following description, it is assumed that the substrate W is held by a third arm 53 of a transfer mechanism 5 and transferred from a vacuum transfer chamber 3 to a supporting unit 41 of a processing chamber 4.

The substrate processing system 1 shown in FIG. 1 is a system of a cluster structure (multi-chamber type system). The substrate processing system 1 includes load-lock chambers 2, a vacuum transfer chamber 3, processing chambers 4, a transfer mechanism 5, sensors 6, and a controller 7. Further, the substrate transfer system for transferring the substrate W includes the transfer mechanism 5, the sensors 6, and the controller 7.

The load-lock chambers 2 are disposed between the vacuum transfer chamber 3 and an atmospheric transfer chamber (not shown). Each of the load-lock chambers 2 has a supporting unit 21 on which the substrate W is placed. The inside of the load-lock chambers 2 can be switched between an atmospheric atmosphere and a vacuum atmosphere. The load-lock chambers 2 and the vacuum transfer chamber 3 in a vacuum atmosphere communicate with each other by opening and closing gate valves 22. The load-lock chambers 2 and the atmospheric transfer chamber (not shown) in an atmospheric atmosphere communicate with each other by opening and closing gate valves (not shown). The switching between the vacuum atmosphere and the atmospheric atmosphere in the load-lock chambers 2 is controlled by the controller 7.

The vacuum transfer chamber 3 is depressurized to a predetermined vacuum atmosphere. Further, the transfer mechanism 5 for transferring the substrate W is disposed in the vacuum transfer chamber 3.

The processing chambers 4 are disposed adjacent to the vacuum transfer chamber 3. Each of the processing chambers 4 has the supporting unit 41 on which the substrate W is placed. The insides of the processing chambers 4 are depressurized to a predetermined vacuum atmosphere, and desired treatment (e.g., etching, film formation, cleaning, ashing, or the like) is performed on the substrates W placed on the supporting units 41 in the processing chambers 4. The processing chambers 4 and the vacuum transfer chamber 3 communicate with each other by opening and closing gate valves 42. Operations of individual components for treatment in the processing chambers 4 are controlled by the controller 7.

The transfer mechanism 5 loads and unloads the substrate W between the load-lock chamber 2 and the vacuum transfer chamber 3 by opening and closing of the gate valve 22. Further, the transfer mechanism 5 loads and unloads the substrate W between the processing chamber 4 and the vacuum transfer chamber 3 by opening and closing of the gate valve 42. The operation of the transfer mechanism 5 and the opening and closing of the gate valves 22 and 42 are controlled by the controller 7.

The transfer mechanism 5 is configured as, e.g., a multi-joint arm including a base portion 50, a first arm 51, a second arm 52, and a third arm 53. The base portion 50 and one side of the first arm 51 in a longitudinal direction are rotatably connected by a rotation shaft 55. The other side of the first arm 51 in the longitudinal direction and one side of the second arm 52 in the longitudinal direction are rotatably connected by a rotation shaft 56. The other side of the second arm 52 in the longitudinal direction and one side of the third arm 53 in the longitudinal direction are rotatably connected by a rotation shaft 57. The other side of the third arm 53 in the longitudinal direction has a holder 53a for holding (placing) the substrate W.

The sensors (measurer) 6 for detecting the substrates W transferred by the transfer mechanism 5 are disposed in the vacuum transfer chamber 3 to correspond to the processing chambers 4 and the load-lock chambers 2. Each of the sensors 6 is disposed at a position through which the substrate W passes when the transfer mechanism 5 loads the substrate W from the vacuum transfer chamber 3 into the processing chamber 4 or the load-lock chamber 2 or when the transfer mechanism 5 unloads the substrate W from the processing chamber 4 or the load-lock chamber 2 into the vacuum transfer chamber 3.

Each of the sensors 6 includes two sensors 6a and 6b. The sensors 6a and 6b, e.g., photoelectric sensors, can detect four points on an outer edge of the substrate W when the substrate W transferred by the transfer mechanism 5 passes through the sensors 6a and 6b. The controller 7 (center position calculator 72 to be described later) detects outer edge coordinates of the substrate W held by the third arm 53 based on the detection of the outer edge of the substrate W by the sensor 6 (the sensors 6a and 6b) and the operation of the transfer mechanism 5 at that time. Then, the controller 7 calculates the center position of the substrate W from the detected outer edge coordinates of the four points. Accordingly, the sensor 6 and the controller 7 function as a measurer for measuring the center position of the substrate W held by the third arm 53. Hence, the controller 7 detects displacement (the amount of eccentricity) between a preset reference position (center position of the holder 53a) of the third arm 53 on which the substrate W is placed and the center position of the substrate W held by the third arm 53 that is detected based on the sensor 6.

The controller 7 includes a central processing unit (CPU), a read only memory (ROM), a random access memory (RAM), and a hard disk drive (HDD). The controller 7 may include another storage area such as a solid state drive (SSD) or the like other than the HDD. A recipe in which a process sequence, process conditions, and transfer conditions are set is stored in the storage area such as the HDD, the RAM, or the like.

The CPU controls the processing of the substrate W in each processing chamber based on the recipe, and controls the transfer of the substrate W. The HDD or the RAM may store a program for executing the processing of the substrate W or the transfer of the substrate W in each processing chamber. The program may be stored in a storage medium and provided, or may be provided from an external device via a network.

<Transfer Mechanism>

Figure 2:
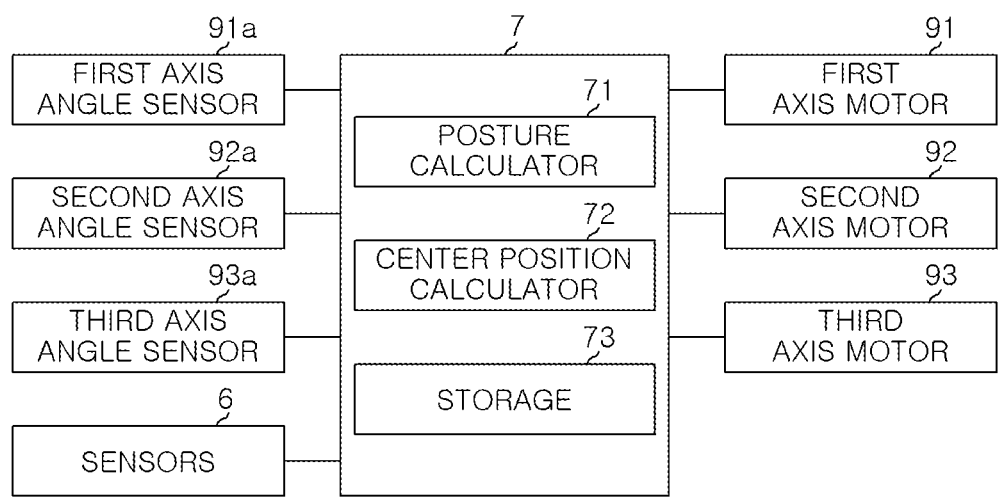
FIG. 2 is an example of a functional block diagram of a controller.

Next, the control of the transfer mechanism 5 will be described with reference to FIG. 2. FIG. 2 is an example of a functional block diagram of the controller 7.

The detection signal of the sensor 6 is input to the controller 7.

The transfer mechanism 5 includes a first axis motor 91, a second axis motor 92, and a third axis motor 93. The first axis motor 91 is disposed in the first arm 51. The first axis motor 91 rotates the first arm 51 with respect to the base portion 50 about the rotation shaft 55. The second axis motor 92 is disposed in the first arm 51. The second axis motor 92 rotates the second arm 52 with respect to the first arm 51 about the rotation shaft 56. The third axis motor 93 is disposed in the second arm 52. The third shaft motor 93 rotates the third arm 53 with respect to the second arm 52 about the rotation shaft 57.

The transfer mechanism 5 includes a first axis angle sensor 91a, a second axis angle sensor 92a, and a third axis angle sensor 93a. The first axis angle sensor 91a detects a rotation angle of the first axis motor 91. The second axis angle sensor 92a detects a rotation angle of the second axis motor 92. The third axis angle sensor 93a detects a rotation angle of the third axis motor 93. The first axis angle sensor 91a, the second axis angle sensor 92a, and the third axis angle sensor 93a may be, e.g., encoders. The detection values of the first axis angle sensor 91a, the second axis angle sensor 92a, and the third axis angle sensor 93a are input to the controller 7.

The controller 7 controls the operation of the transfer mechanism 5 by controlling the first axis motor 91, the second axis motor 92, and the third axis motor 93 based on the detection values of the first axis angle sensor 91a, the second axis angle sensor 92a, and the third axis angle sensor 93a.

The controller 7 further includes a posture calculator 71, a center position calculator 72, and a storage 73.

The posture calculator 71 calculates a posture of the transfer mechanism 5 based on the detection values of the angle sensors 91a to 93a. The reference position (the center position of the holder 53a) of the third arm 53 on which the substrate W is placed is calculated based on the calculated posture of the transfer mechanism 5.

The center position calculator 72 detects the outer edge coordinates of the substrate W held by the third arm 53 based on the detection of the outer edge of the substrate W by the sensor 6 (the sensors 6a and 6b) and the operation of the transfer mechanism 5 at that time. Then, the controller 7 calculates the center position of the substrate W from the detected outer edge coordinates of the four points.

The storage 73 stores calibration data (adjustment value) of the sensor 6.

Here, the calibration of the sensor 6 indicates an operation of acquiring position information of the sensor 6 with respect to the transfer mechanism 5. Specifically, the substrate W passes a position above the sensor 6 in a state where the substrate W is held by the holder 53*a* such that the center position of the holder 53*a* and the center position of the substrate W coincide with each other. Accordingly, the position information of the sensor 6 with respect to the transfer mechanism 5 is acquired as the calibration data.

The center position calculator 72 detects the center position of the substrate W based on the detection of the outer edge of the substrate W by the sensor 6 (the sensors 6*a* and 6*b*), the reference position calculated by the posture calculator 71, and the calibration data (sensor position) of the sensor 6.

The center position calculator 72 of the controller 7 measures the center position of the substrate W using the sensor 6. Then, the controller 7 calculates the amount of displacement between the center position of the substrate W and the reference position of the third arm 53 (the center position of the holder 53*a*), and corrects a target position. Then, the controller 7 controls the transfer mechanism 5 such that the reference position of the third arm 53 (the center position of the holder 53*a*) becomes the corrected target position. Accordingly, the substrate W can be transferred to the target position.

Next, an example of the operation of the transfer mechanism 5 in the case of transferring the substrate W will be described with reference to FIGS. 3 to 5.

Figure 3A:
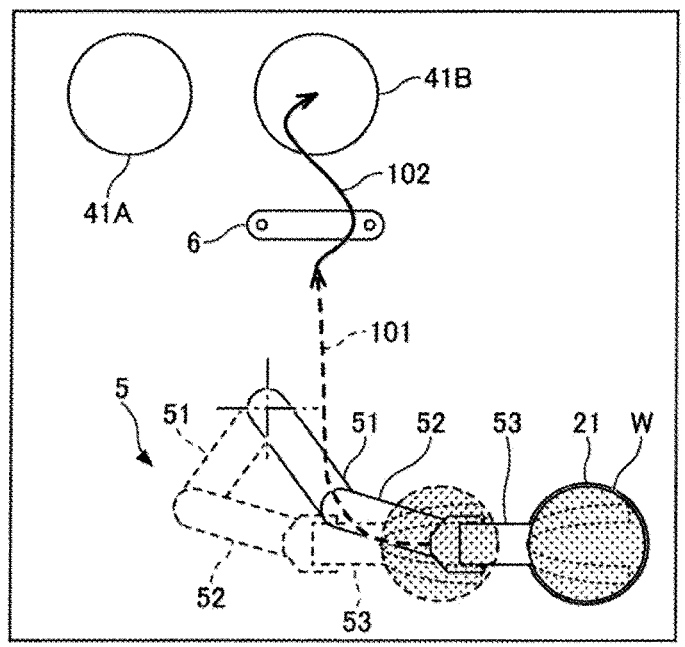
FIGS. 3A and 3B explain an example of an operation of a transfer mechanism in the case of transferring a substrate from a supporting unit to a supporting unit.
Figure 3B:
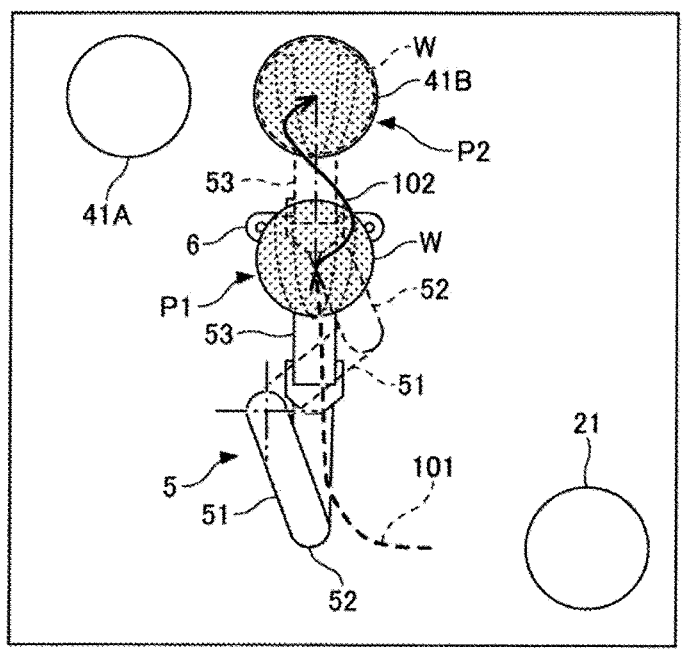

FIGS. 3A and 3B explain examples of the operation of the transfer mechanism 5 in the case of transferring the substrate W from the supporting unit 21 to a supporting unit 41B. FIG. 3A is an example of a diagram explaining the operation of the transfer mechanism 5 in the case of transferring the substrate W from the supporting unit 21. In FIG. 3A, the transfer mechanism 5 at the time of receiving the substrate W from the supporting unit 21 is indicated by solid lines, and the transfer mechanism 5 at the time of transferring the substrate W from the load-lock chamber 2 is indicated by dashed lines. FIG. 3B is an example of a diagram explaining the operation of the transfer mechanism 5 in the case of transferring the substrate W to the supporting unit 41B. In FIG. 3B, the transfer mechanism 5 at a measurement position P1 where the substrate W passes through the sensor 6 is indicated by solid lines, and the transfer mechanism 5 at a target position P2 where the substrate W is delivered to the supporting unit 41B is indicated by dashed lines. The transfer mechanism 5 transfers the substrate W from the supporting unit 21 to the measurement position P1 along a path 101 and transfers the substrate W from the measurement position P1 to the target position P2 along a path 102. The movement on the path 102 is exaggerated.

Figure 4A:
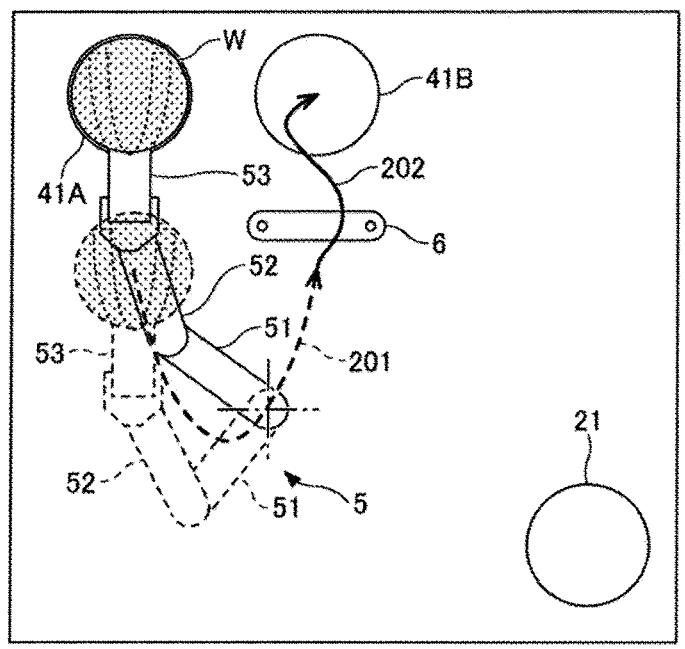
FIGS. 4A and 4B explain an example of the operation of the transfer mechanism in the case of transferring a substrate from a supporting unit to a supporting unit.
Figure 4B:
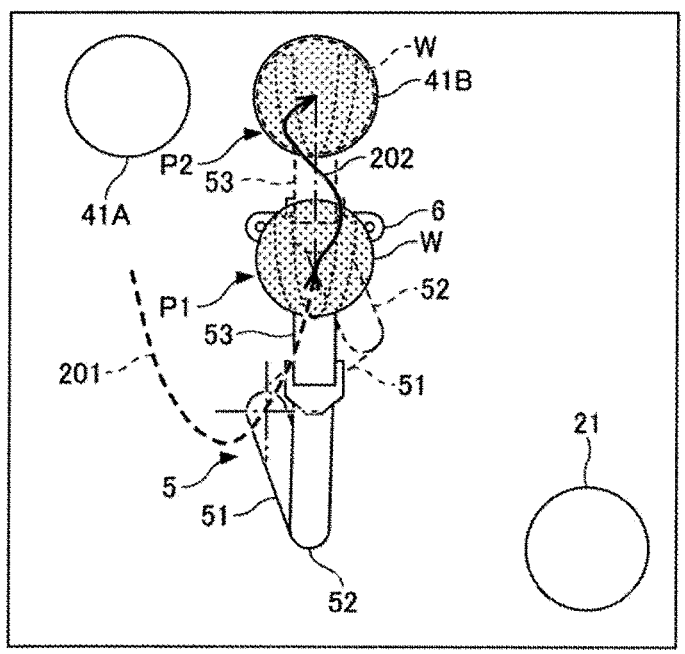

FIGS. 4A and 4B explain examples of the operation of the transfer mechanism 5 in the case of transferring the substrate W from the supporting unit 41A to the supporting unit 41B. FIG. 4A is an example of a diagram explaining the operation of the transfer mechanism 5 in the case of transferring the substrate W from the supporting unit 41A. In FIG. 4A, the transfer mechanism 5 at the time of receiving the substrate W from the supporting unit 41A is indicated by solid lines, and the transfer mechanism 5 at the time of transferring the substrate W from the processing chamber 4 is indicated by dashed lines. FIG. 4B is an example of a diagram explaining the operation of the transfer mechanism 5 in the case of transferring the substrate W to the supporting unit 41B. In FIG. 4B, the transfer mechanism 5 at the measurement position P1 where the substrate W passes through the sensor 6 is indicated by solid lines, and the transfer mechanism 5 at the target position P2 where the substrate W is delivered to the supporting unit 41B is indicated by dashed lines. The transfer mechanism 5 transfers the substrate W from the supporting unit 41A to the measurement position P1 along a path 201 and transfers the substrate W from the measurement position P1 to the target position P2 along a path 202. The movement on the path 202 is exaggerated.

Figure 5:
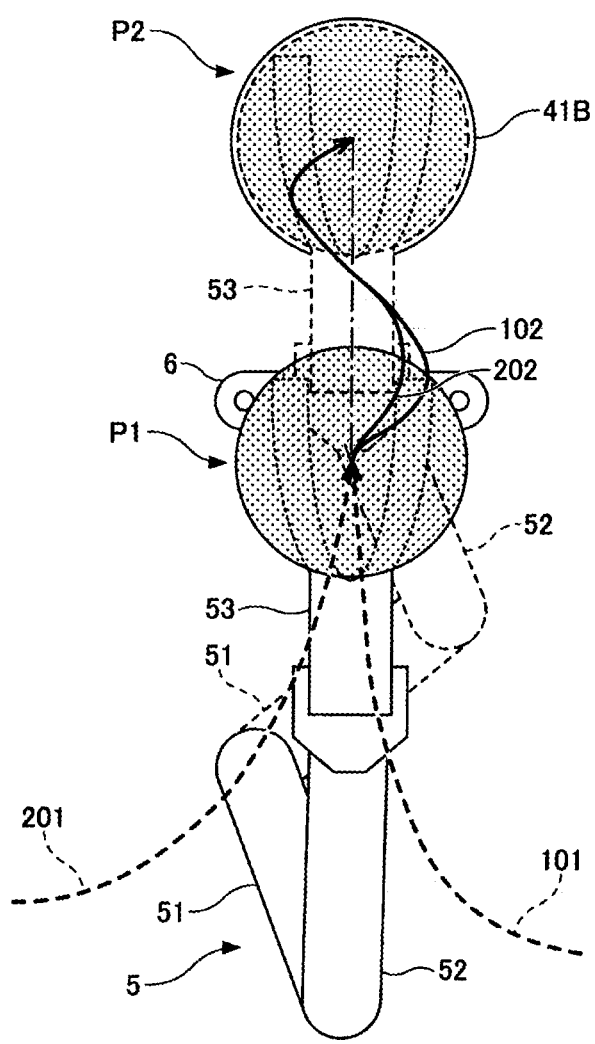
FIG. 5 is an example of a diagram explaining a path for transferring a substrate from a measurement position to a target position.

FIG. 5 is an example of a diagram explaining a path in the case of transferring a substrate from the measurement position P1 to the target position P2. The movement on the paths 102 and 202 is exaggerated.

The posture calculator 71 of the controller 7 calculates the reference position of the third arm 53 based on the detection values of the angle sensors 91*a* to 93*a*. The controller 7 controls the motors 91 to 93 such that the calculated reference position moves from the measurement position P1 to the target position P2 along the path (see dash-dotted lines).

On the other hand, errors occur between the actual paths 102 and 202 and the paths (see dash-dotted lines) based on the detection values of the angle sensors 91*a* to 93*a* due to distortion between the arms of the rotation shafts 55 to 57 of the operating transfer mechanism 5. Further, as shown in FIG. 5, in the case of transferring the substrate W from the measurement position P1 to the target position P2, the path 102 of the substrate W transferred from the supporting unit 21 (in the case of transferring the substrate W from a right side in a transfer direction from the measurement position P1 to the target position P2) is different from the path 102 of the substrate W transferred from the supporting unit 41A (in the case of transferring the substrate W from a left side in the transfer direction from the measurement position P1 to the target position P2). This depends on the operation (the path 101 in FIG. 3 and the path 201 in FIG. 4) immediately before the extension/contraction operation of the transfer mechanism 5 from the measurement position P1 to the target position P2. Therefore, the accuracy in calculating the amount of displacement between the center of the substrate W and the reference position using the sensor 6 decreases.

Here, the storage 73 of the controller 7 stores the calibration data for each transfer path. In other words, the calibration is performed for each transfer path in advance, and the calibration data is stored for each transfer path. The center position calculator 72 calculates the center position of the substrate W using the calibration data corresponding to the transfer path. Accordingly, the accuracy in calculating the amount of displacement between the center position and the reference position of the substrate W using the sensor 6 can be improved. Further, it is possible to improve the transfer accuracy in transferring the substrate W to the target position.

Further, the transfer paths may be grouped. The calibration may be performed for each transfer path group, and the calibration data may be stored for each transfer path group. The center position calculator 72 calculates the center position of the substrate W using the calibration data corresponding to the groups of the transfer paths. Data may be used. Accordingly, the number of calibration operations can be reduced, and the amount of data stored in the storage 73 can be reduced.

Figure 6A:
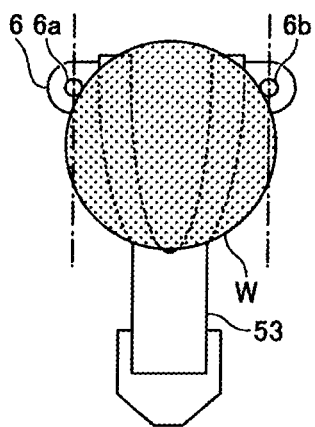
FIGS. 6A to 6C are examples of diagrams showing relationship between a shape of a third arm holding a substrate and a sensor.
Figure 6B:
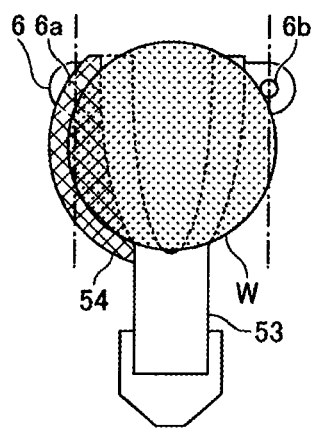
Figure 6C:
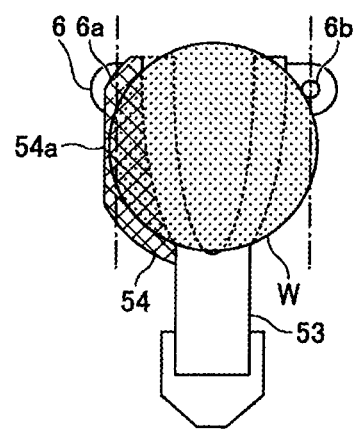

FIGS. 6A to 6C are examples of diagrams showing the relationship between the shape of the third arm 53 holding the substrate W and the sensor 6. Further, in FIGS. 6A to 6C, the dashed-dotted lines indicate trajectories through which the sensors 6*a* and 6*b* pass.

In the example shown in FIG. 6A, the sensor 6*a* and the sensor 6*b* detect four points on the outer edge of the substrate W. Accordingly, the center position calculator 72 can calculate the center position of the substrate W.

On the other hand, in the example shown in FIG. 6B, the third arm 53 has a protruding portion 54 protruding outward from the substrate W. The outer edge of the protruding portion 54 has an arc shape centered on the reference position of the third arm 53. A radius of the arc shape of the protruding portion 54 is a known value and is stored in the storage 73 in advance. The sensor 6a detects two points on the outer edge of the protruding portion 54. The sensor 6b detects two points on the outer edge of the substrate W.

The center position calculator 72 calculates the center of the arc of the protruding portion 54, i.e., the reference position of the third arm 53, based on the two points on the outer edge of the protruding portion 54 detected by the sensor 6a and the radius of the arc of the protruding portion 54. In other words, the sensor 6a and the center position calculator 72 function as a reference position measurer for measuring the reference position of the third atm 53.

Further, the center position calculator 72 calculates the center position of the substrate W based on the two points on the outer edge of the substrate W detected by the sensor 6b and the diameter of the substrate W. In other words, the sensor 6b and the center position calculator 72 function as a center position measurer for measuring the center position of the substrate W. A preset value may be used as the diameter of the substrate W. Alternatively, the diameter of the substrate W may be measured in a preliminary step.

In the configuration shown in FIG. 6B, the reference position of the third arm 53 (the center of the arc of the protruding portion 54) is detected using the sensor 6a. Further, the timing of detecting the reference position of the third arm 53 using the sensor 6a and the timing of detecting the center position of the substrate W using the sensor 6b can be set to be close to each other. Therefore, the errors contained in both data can become equal. Accordingly, when the amount of displacement between the center position of the substrate W and the reference position of the third arm 53 (the center position of the holder 53a) is calculated, the error is canceled by the difference, and the amount of displacement between the center position and the reference position of the substrate W can be obtained accurately. Hence, it is possible to improve the accuracy in calculating the amount of displacement between the center position and the reference position of the substrate W using the sensor 6. Further, it is possible to improve the transfer accuracy in transferring the substrate W to the target position.

The protruding portion 54 does not necessarily have the shape shown in FIG. 6B. As shown in FIG. 6C, a notch portion 54a may be formed outside the position through which the sensor 6a passes. Accordingly, a width of the third arm 53 can be reduced.

Next, the temperature change of the transfer mechanism 5 will be described. The transfer mechanism 5 has therein the motors 91 to 93 as heat sources. When the substrate W is transferred to a high-temperature processing chamber 4, heat is input from the processing chamber 4 to the transfer mechanism 5. When the high-temperature substrate W processed in the processing chamber 4 is transferred, heat is input from the substrate W to the transfer mechanism 5. Therefore, link lengths of the first arm 51 and the second arm 52 change due to thermal expansion. Further, angle transmission errors of the rotation shafts 55 to 57 change due to thermal expansion of gears or the like connected to the motors 91 to 93. Therefore, an error may occur between the reference position calculated by the posture calculator 71 and the actual reference position. Accordingly, the accuracy in calculating the amount of displacement between the center of the substrate W and the reference position using the sensor 6 may decrease.

Here, the storage 73 of the controller 7 stores calibration data for each temperature. For example, the storage 73 stores calibration data at room temperature and calibration data at a high temperature.

Here, a method for measuring the calibration data at room temperature and the calibration data at a high temperature will be described.

First, at room temperature, the substrate W is set on the supporting unit 41 such that the target position and the center position of the substrate W coincide with each other. The transfer mechanism 5 receives the substrate W from the supporting unit 41 and is extended and contracted so that the substrate W held by the holder 53a passes the position above the sensor 6. Accordingly, the calibration data of the sensor 6 at room temperature is acquired. Then, the substrate W is returned to the supporting unit 41.

Next, the transfer mechanism 5 is warmed up. The transfer mechanism 5 may be warmed up by operating the motors 91 to 93. Further, the transfer mechanism 5 may be warmed up by transferring the substrate W to the high-temperature processing chamber 4.

When the transfer mechanism 5 reaches a predetermined temperature (high-temperature state), the transfer mechanism 5 receives the substrate W from the supporting unit 41 and is extended/contracted so that the substrate W held by the holder 53a passes the position above the sensor 6. Accordingly, the calibration data of the sensor 6 at a high temperature is acquired. Then, the substrate W is returned to the supporting unit 41.

The calibration data may be acquired for each of a plurality of temperatures of the transfer mechanism 5.

Next, the processing in the case of transferring the substrate W by the transfer mechanism 5 will be described. In the case of transferring the substrate W, the controller 7 generates reference data based on the temperature of the transfer mechanism 5 during the transfer of the substrate W and the calibration data for each temperature. For example, the reference data is generated by temporarily approximating the calibration data for each temperature.

The center position calculator 72 calculates the center position using the reference data generated based on the temperature of the transfer mechanism 5 as the calibration data of the sensor 6.

By using the reference data based on the temperature of the transfer mechanism 5, it is possible to reduce the influence of the extension of the arms 51 and 52 due to the heat of the transfer mechanism 5 or the angle transmission error. Further, it is possible to improve the accuracy in calculating the amount of displacement between the center position and the reference position of the substrate W using the sensor 6. Further, it is possible to improve the transfer accuracy in transferring the substrate W to the target position.

Further, another method for improving the transfer accuracy will be described with reference to FIGS. 7 and 8.

Figure 7:
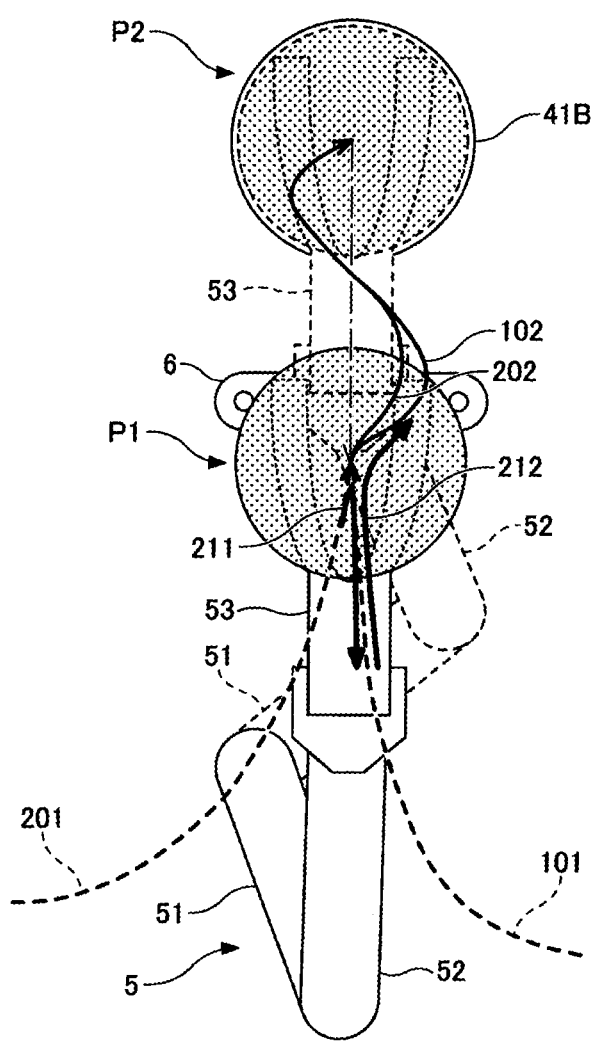
FIG. 7 is an example of a diagram explaining a path for transferring a substrate to the target position via the measurement position.

FIG. 7 is an example of a diagram explaining a path in the case of transferring the substrate W to the target position P2 via the measurement position P1. Here, when the substrate W is transferred to the measurement position P1 along the path 101, the substrate W is transferred to the target position P2 without change in direction. At this time, the substrate W moves along the path 102.

On the other hand, when the substrate W is transferred to the measurement position P1 along the path 201, the substrate W is transferred in the opposite direction of the path 101 as indicated by a path 211. Then, the substrate W is transferred to the measurement position P1 through a path 212 along the path 101. Then, the transfer mechanism 5 transfers the substrate W from the measurement position P1 to the target position P2. The substrate W is transferred along the path 102 by the above-described operation.

In other words, in the case of transferring the substrate W from the right side in the transfer direction from the measurement position P1 to the target position P2, the substrate W is transferred without change in direction. On the other hand, in the case of transferring the substrate W from the left side in the transfer direction from the measurement position P1 to the target position P2, first, the substrate W is transferred to the right side in the transfer direction, and then transferred from the right side in the transfer direction. Although the configuration in which the substrate W is transferred from the right side has been described as an example, the present disclosure is not limited thereto, and a configuration in which the substrate W is transferred from the left side may be employed.

When the path 201 of the substrate W to the measurement position P1 is different from the path 101, the operations (the paths 101 and 212) immediately before the extension and contraction operation of the transfer mechanism 5 from the measurement position P1 to the target position P2 can become the same by transferring the substrate W through the paths 211 and 212 along the path 101. Accordingly, when the substrate W is transferred from the supporting unit 21 to the supporting unit 41B and when the substrate W is transferred from the supporting unit 41A to the supporting unit 41B, the substrate W passes through the sensor 6 under the same conditions. Hence, even in the case of using the same calibration data, it is possible to improve the accuracy in calculating the amount of displacement between the center position of the substrate W and the reference position using the sensor 6. Further, it is possible to improve the transfer accuracy in transferring the substrate W to the target position.

Figure 8:
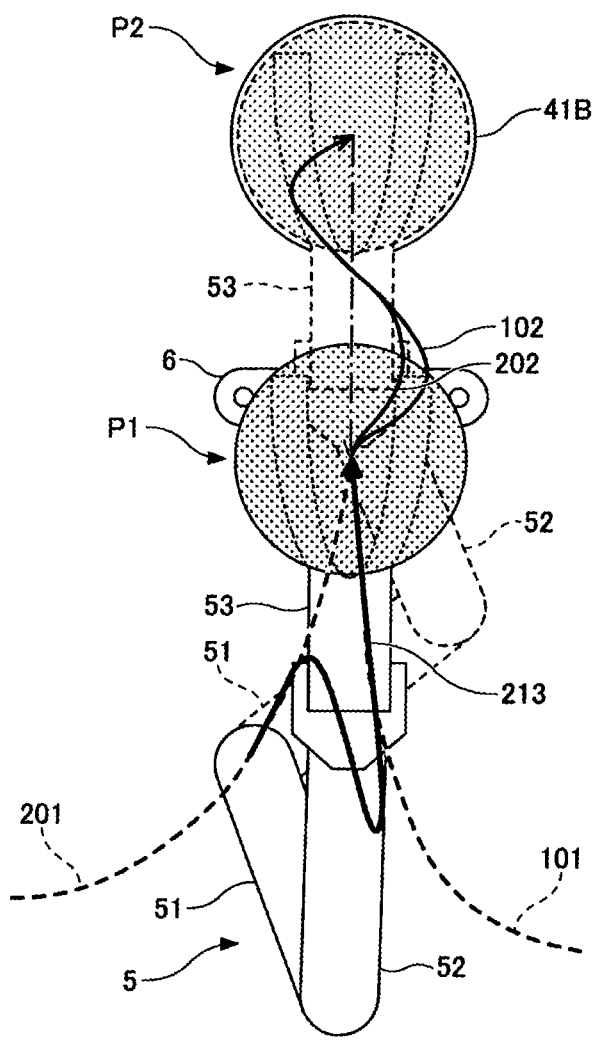
FIG. 8 is an example of a diagram explaining a path for transferring a substrate to the target position via the measurement position.

FIG. 8 is an example of a diagram explaining a path for transferring the substrate W to the target position P2 via the measurement position P1. As shown in FIG. 8, when the substrate W is transferred from the path 201, the substrate W may be deviated from the path 201 on the way to the measurement position P1 and reach the measurement position P1 along the path 101 as indicated by a path 213.

In other words, in the case of transferring the substrate W from the right side in the transfer direction from the measurement position P1 to the target position P2, the substrate W is transferred without change in direction. On the other hand, in the case of transferring the substrate W from the left side in the transfer direction from the measurement position P1 to the target position P2, first, the substrate W is transferred to the right side in the transfer direction, and then transferred from the right side in the transfer direction. Although the configuration in which the substrate W is transferred from the right side has been described as an example, the present disclosure is not limited thereto, and a configuration in which the substrate W is transferred from the left side may be employed.

Accordingly, similarly to the case shown in FIG. 7, the operations (the paths 101 and 213) immediately before the extension and contraction operation of the transfer mechanism 5 from the measurement position P1 to the target position P2 can become the same. Hence, when the substrate W is transferred from the supporting unit 21 to the supporting unit 41B and when the substrate W is transferred from the supporting unit 41A to the supporting unit 41B, the substrate W passes through the sensor 6 under the same conditions. As a result, even in the case of using the same calibration data, it is possible to improve the accuracy in calculating the amount of displacement between the center position of the substrate W and the reference position using the sensor 6. Further, it is possible to improve the transfer accuracy in transferring the substrate W to the target position.

The operations of the transfer mechanism 5 shown in FIGS. 7 and 8 increase the transfer time. Therefore, the controller 7 may include a mode in which the transfer accuracy is prioritized and a mode in which the transfer time is prioritized and switch an operation mode therebetween. In the mode in which the transfer accuracy is prioritized, the substrate W is transferred to the measurement position P1 in the same direction (see the paths 101, 212, and 213). In the mode in which the transfer time is prioritized, the substrate W is transferred to the measurement position P1 along different paths (see the paths 101 and 201). Accordingly, it is possible to select whether to prioritize the transfer accuracy or the transfer speed.

In the examples shown in FIGS. 7 and 8, the case in which the transfer path is changed when the substrate W is transferred from one supporting unit 21 or 41A to the other supporting unit 41B has been described as an example. However, the present disclosure is not limited thereto. When the substrate W is transferred to the supporting unit 41B, the substrate W may pass through a predetermined supporting unit 21. For example, when the substrate W is transferred from the supporting unit 41A to the supporting unit 41B, first, the transfer mechanism 5 transfers the substrate W from the supporting unit 41A to the supporting unit 21, and then from the supporting unit 21 to the supporting unit 41B. When the substrate W is transferred from the supporting unit 21 to the supporting unit 41B, the transfer mechanism 5 directly transfers the substrate W from the supporting unit 21 to the supporting unit 41B.

Accordingly, the operations (the path 101) immediately before the extension and contraction operation of the transfer mechanism 5 from the measurement position P1 to the target position P2 can become the same. Further, even in the case of using the same calibration data, it is possible to improve the accuracy in calculating the amount of displacement between the center position of the substrate W and the reference position using the sensor 6. Further, it is possible to improve the transfer accuracy in transferring the substrate W to the target position.

Figure 9:
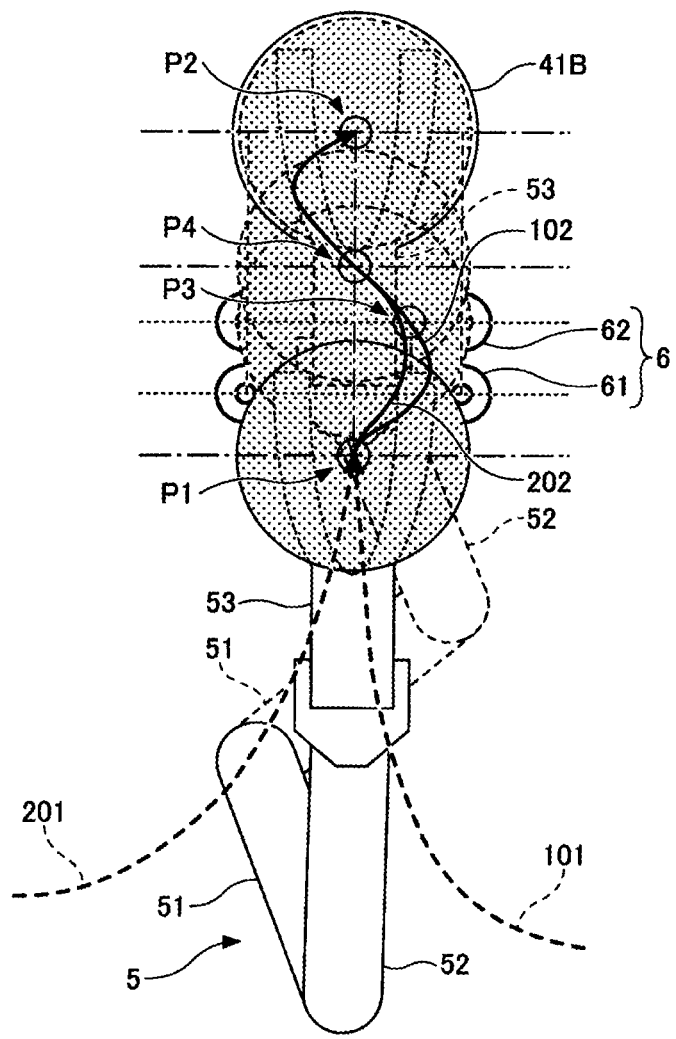
FIG. 9 is an example of a diagram explaining a path for transferring a substrate to the target position via the measurement position.

FIG. 9 is an example of a diagram explaining a path for transferring the substrate W to the target position P2 via the measurement position P1. The sensor 6 includes a sensor 61 and a sensor 62.

Here, the measurement position P1 is a position (light blocking position) of the sensor 61) where the substrate W blocks the sensor 61 and the outer edge of the substrate W is detected. At this position, the path 101 and the path 201 coincide with each other.

A position P3 is a position (light transmitting position of the sensor 61) where the substrate W passes through the sensor 61 and the outer edge of the substrate W is detected. At this position, the path 102 and the path 202 are misaligned. Therefore, in the case of using the same reference data, the measurement accuracy of the amount of displacement between the center position of the substrate W and the reference position decreases due to the transfer paths.

A position P4 is a position in the middle of the path from the position P3 to the target position P2, and is a position (the light transmitting position of the sensor 62) where the substrate W passes through the sensor 62 and the outer edge of the substrate W is detected. Here, the path 102 and the path 202 are joined before the position P4 and directed toward the target position P2.

Here, the sensor 6 detects the outer edge of the substrate W at a position that does not depend on the operation (path) of the transfer mechanism 5. In other words, in the example shown in FIG. 9, the sensor 6 calculates the center position of the substrate W based on the light blocking position of the sensor 61 and the light transmitting position of the sensor 62. Accordingly, even if the operations (the paths 102 and 202) from the measurement position P1 to the target position P2 are different due to the different operations (the paths 101 and 201) immediately before the extension and contraction operation of the transfer mechanism 5 from the measurement position P1 to the target position P2, the outer edge of the substrate W can be detected at a position that does not depend on the operation. Hence, even in the case of using the same calibration data, it is possible to improve the accuracy in calculating the amount of displacement between the center position of the substrate W and the reference position using the sensor 6. Further, it is possible to improve the transfer accuracy in transferring the substrate W to the target position.

While the embodiments of the substrate processing system 1 and the substrate transfer system have been described above, the present disclosure is not limited to the above-described embodiments, and various changes and modifications can be made within the scope of the gist of the present disclosure described in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A control method of a transfer mechanism for transferring a substrate and having a holder for holding the substrate, comprising:
   detecting an outer edge of the substrate transferred by the transfer mechanism and measuring a center position of the substrate using a preset adjustment value corresponding to a path for transferring the substrate;
   correcting a target position based on an amount of displacement between the center position of the substrate and a reference position of the holder; and
   controlling the transfer mechanism such that the reference position of the holder becomes the corrected target position,
   wherein the measuring of the center position of the substrate is performed by:
   acquiring a position information of the sensor with respect to the transfer mechanism as a calibration data in a state where the substrate is held by the holder such that the reference position of the holder and the center position of the substrate coincide with each other;
   storing the calibration data for each transfer path as the preset adjustment value; and
   calculating the center position of the substrate using the preset adjustment value corresponding to the path for transferring the substrate.

2. The control method of claim 1, wherein the holder has a protruding portion protruding from the substrate held by the holder, and
   in addition to that the outer edge of the transferred substrate is detected, the reference position of the holder is measured by detecting an outer edge of the protruding portion.

3. The control method of claim 2, wherein the outer edge of the protruding portion has an arc shape centered on the reference position of the holder.

4. The control method of claim 1, wherein the adjustment value corresponding to a temperature of the transfer mechanism is stored, and
   the center position of the substrate is measured using the path for transferring the substrate and the adjustment value corresponding to the temperature of the transfer mechanism.

5. A transfer system comprising:
   a transfer mechanism for transferring a substrate and having a holder for holding the substrate;
   a measurer for detecting an outer edge of the substrate transferred by the transfer mechanism and measuring a center position of the substrate; and
   a controller for controlling the transfer mechanism,
   wherein the measurer measures the center position of the substrate by: acquiring a position information of the measurer with respect to the transfer mechanism as a calibration data in a state where the substrate is held by the holder such that a reference position of the holder and the center position of the substrate coincide with each other; storing the calibration data for each transfer path as a preset adjustment value; and calculating the center position of the substrate using the preset adjustment value corresponding to the path for transferring the substrate, and
   the controller corrects a target position based on the reference position of the holder and an amount of displacement between the center position of the substrate and the reference position of the holder, and controls the transfer mechanism such that the reference position of the holder becomes the corrected target position.

6. A substrate transfer system comprising:
   a transfer mechanism for transferring a substrate and having a holder for holding the substrate;
   a measurer for detecting an outer edge of the substrate transferred by the transfer mechanism and measuring a center position of the substrate; and
   a controller for controlling the transfer mechanism,
   wherein the holder has a protruding portion that protrudes from the substrate held by the holder, and
   the controller causes the measurer to measure the center position of the substrate by: acquiring a position information of the measurer with respect to the transfer mechanism as a calibration data in a state where the substrate is held by the holder such that a reference position of the holder and the center position of the substrate coincide with each other; storing the calibration data for each transfer path as a preset adjustment value; and calculating the center position of the substrate using the preset adjustment value corresponding to the path for transferring the substrate, corrects a target position based on the center position of the substrate and the reference position of the holder, and controls the transfer mechanism such that the reference position of the holder becomes the corrected target position.

7. The substrate transfer system of claim 6, wherein the outer edge of the protruding portion has an arc shape centered on the reference position of the holder.

\* \* \* \* \*